United States Patent
Park et al.

(10) Patent No.: US 8,185,358 B2
(45) Date of Patent: May 22, 2012

(54) APPARATUS FOR MEASURING DISTORTION POWER QUALITY INDEX AND METHOD OF OPERATING THE APPARATUS

(75) Inventors: Jung-Wook Park, Seoul (KR); Soon Lee, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 1156 days.

(21) Appl. No.: 11/989,228

(22) PCT Filed: Nov. 8, 2007

(86) PCT No.: PCT/KR2007/005628
§ 371 (c)(1),
(2), (4) Date: Jan. 23, 2008

(87) PCT Pub. No.: WO2009/028763
PCT Pub. Date: Mar. 5, 2009

(65) Prior Publication Data
US 2010/0131243 A1 May 27, 2010

(30) Foreign Application Priority Data
Aug. 24, 2007 (KR) .................. 10-2007-0085441

(51) Int. Cl.
*G01R 23/20* (2006.01)
*G06F 17/40* (2006.01)

(52) U.S. Cl. .............. 702/198; 702/64; 702/65; 702/69; 702/60; 324/620; 324/623

(58) Field of Classification Search .................. 702/198, 702/64, 65, 69, 60
See application file for complete search history.

(56) References Cited

U.S. PATENT DOCUMENTS

| | | | | |
|---|---|---|---|---|
| 5,627,759 | A * | 5/1997 | Bearden et al. | 702/62 |
| 6,675,071 | B1 * | 1/2004 | Griffin et al. | 700/286 |
| 7,469,190 | B2 * | 12/2008 | Bickel | 702/60 |
| 2005/0114057 | A1 * | 5/2005 | Curtis et al. | 702/81 |

OTHER PUBLICATIONS

Lee et al.: "Estimation of Electric Load Composition on a Utility Side," IEEE, School of Electrical and Electronic Engineering, Yonsei University, Seoul, Korea, Oct. 2006, pp. 1425-1431.

* cited by examiner

*Primary Examiner* — Hal Wachsman
(74) *Attorney, Agent, or Firm* — Nixon & Vanderhye PC

(57) ABSTRACT

A method of measuring a power quality index. A total current waveform of an ingress from a customer, and a current waveform and a voltage waveform of each of at least one load installed at the customer are measured. A load composition (LC) of the customer using the total current waveform of the ingress and the current waveform of each of the at least one load is computed. A total harmonic distortion (THD) of each of the at least one load using the current waveform and the voltage waveform of each of the at least one load is computed. Thereafter, a distortion power quality index (DPQI) of each of the at least one load using the LC and the THD is computed.

20 Claims, 6 Drawing Sheets

APPARATUS FOR MEASURING DISTORTION POWER QUALITY INDEX AND METHOD OF OPERATING THE APPARATUS

This application is the U.S. national phase of International Application No. PCT/KR2007/005628 filed 8 Nov. 2007 which designated the U.S. and claims priority to KR 10-2007-0085441 filed 24 Aug. 2007, the entire contents of each of which are hereby incorporated by reference.

TECHNICAL FIELD

The present invention relates to an apparatus and method of measuring a power quality index, and more particularly, to an apparatus and method of measuring a power quality index which computes a distortion power quality index (DPQI), which is a relative proportion of distortion power generated due to each nonlinear load of a customer of a distributed power system, using a load composition (LC) of the customer and a total harmonic distortion (THD) with respect to each load of the customer, and thereby may evaluate the deteriorating nonlinear load power quality more accurately without directly measuring distortion power.

BACKGROUND ART

Power quality is critical in terms of an engineering aspect of a power system and an efficient power supply. Also, power quality is now more significant due to the competition of power market.

Along with the development of power electronic technologies, installing a nonlinear load at each customer increases. Since the increase in a nonlinear load installed in a distributed power system customer generates a harmonic distortion in a current waveform flowing in each electrical load, a current waveform distortion is caused. Such a disadvantage generates distortion power in a power transfer process, and thus a power system is inefficiently operated and low quality power is supplied to a customer.

A selection of load, which generates distortion power and causes a deterioration of power quality, is critical to prevent power quality from being deteriorated due to an increase in a nonlinear load. A power quality index with respect to each load of a customer is to be first measured for the selection of load. In this instance, a power quality index is to be measured considering the generation of distortion power.

However, a power quality index measurement in a conventional art does not consider a distortion power generation of each load. Accordingly, the power quality index measurement is not closely related to distortion power associated with actual power quality. For example, since a total harmonic distortion (THD) measurement considers only proportion of waveform distortion, distortion power associated with actual power quality is not fully reflected.

Accordingly, a development of power quality index measurement method, which may show distortion power generation caused by a harmonic generated from a nonlinear load as a quantified value, is required.

DISCLOSURE OF INVENTION

Technical Goals

The present invention provides an apparatus and method of measuring a power quality index which computes a distortion power quality index (DPQI), which is a relative proportion of a distortion power generated due to each nonlinear load of a customer, using a load composition (LC) of the customer and a total harmonic distortion (THD) with respect to each load of the customer, and thereby may measure power quality reflecting a distortion power generation without directly measuring distortion power.

Technical Solutions

According to an aspect of the present invention, there is provided a method of measuring a power quality index, including: measuring a total current waveform of an ingress from a customer, and a current waveform and a voltage waveform of each of at least one load installed at the customer; computing a load composition (LC) of the customer using the total current waveform of the ingress and the current waveform of each of the at least one load; computing a total harmonic distortion (THD) of each of the at least one load using the current waveform and the voltage waveform of each of the at least one load; and computing a distortion power quality index (DPQI) of each of the at least one load using the LC and the THD.

According to an aspect of the present invention, there is provided an apparatus for measuring a power quality index, including: a current waveform measurement unit measuring a total current waveform of an ingress from a customer, and a current waveform of each of at least one load installed in the customer; a voltage waveform measurement unit measuring a voltage waveform of each of the at least one load; an LC computation unit computing an LC of the customer using the total current waveform of the ingress and the current waveform of each of the at least one load; a THD computation unit computing a THD of each of the at least one load using the current waveform and the voltage waveform of each of the at least one load; and a DPQI computation unit computing a DPQI of each of the at least one load using the LC and the THD.

According to an aspect of the present invention, there is provided a wattmeter, including: a current waveform measurement unit measuring a total current waveform of an ingress from a customer, and a current waveform of each of at least one load installed in the customer; a voltage waveform measurement unit measuring a voltage waveform of each of the at least one load; an LC computation unit computing an LC of the customer using the total current waveform of the ingress and the current waveform of each of the at least one load; a THD computation unit computing a THD of each of the at least one load using the current waveform and the voltage waveform of each of the at least one load; and a DPQI computation unit computing a DPQI of each of the at least one load using the LC and the THD.

Advantageous Effects

According to an apparatus and method of measuring a power quality index which computes a distortion power quality index (DPQI), which is a relative proportion of distortion power generated due to each nonlinear load of a customer, using a load composition (LC) of the customer and a total harmonic distortion (THD) with respect to each load of the customer, and thereby may evaluate a power quality where distortion power generation is reflected more accurately without directly measuring distortion power.

BEST MODE FOR CARRYING OUT THE INVENTION

Hereinafter, embodiments of the present invention are described in detail by referring to the figures.

Figure 1:
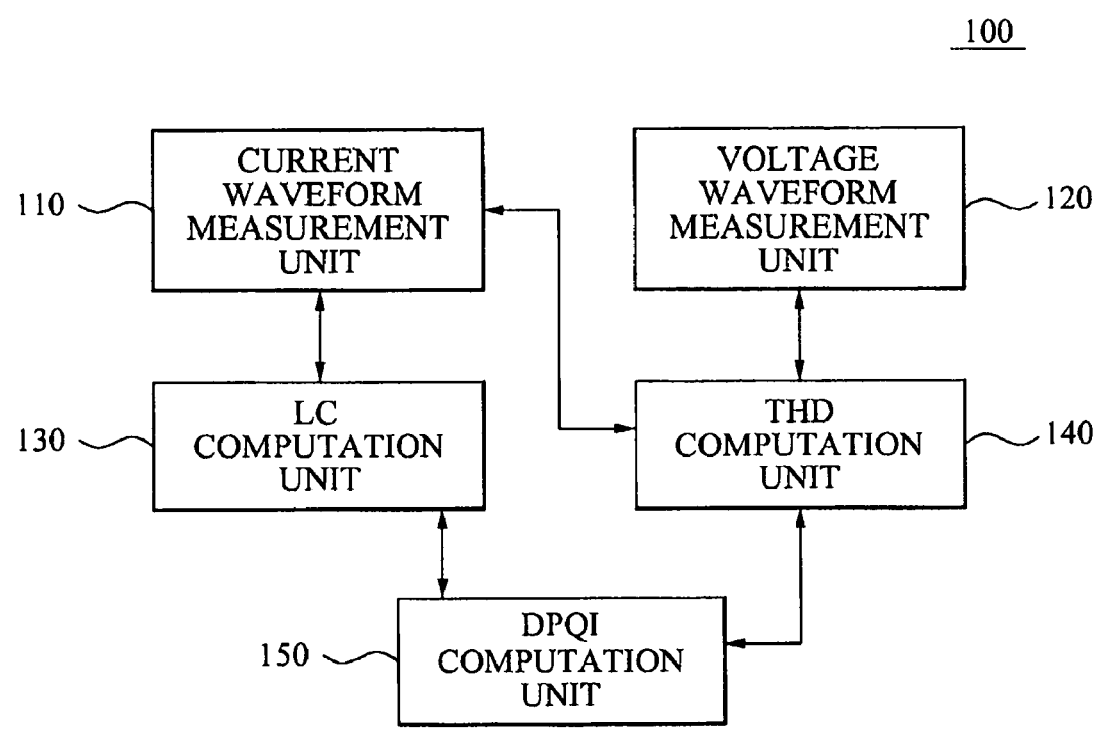
FIG. 1 is a diagram illustrating an apparatus for measuring a power quality index according to an embodiment of the present invention.

FIG. 1 is a diagram illustrating an apparatus for measuring a power quality index 100 according to an embodiment of the present invention.

The apparatus for measuring a power quality index 100 includes a current waveform measurement unit 110, a voltage waveform measurement unit 120, a load composition (LC) computation unit 130, a total harmonic distortion (THD) computation unit 140, and a distortion power quality index (DPQI) computation unit 150.

The apparatus for measuring a power quality index 100 may be embodied as a part of a wattmeter installed at a customer, and embodied to be separated from the wattmeter.

The current waveform measurement unit 110 measures a total current waveform of the ingress from the customer, and a current waveform of each of at least one load installed at the customer. Also, the voltage waveform measurement unit 120 measures a voltage waveform of each of the at least one load, which is described in detail with reference to FIG. 2.

Figure 2:
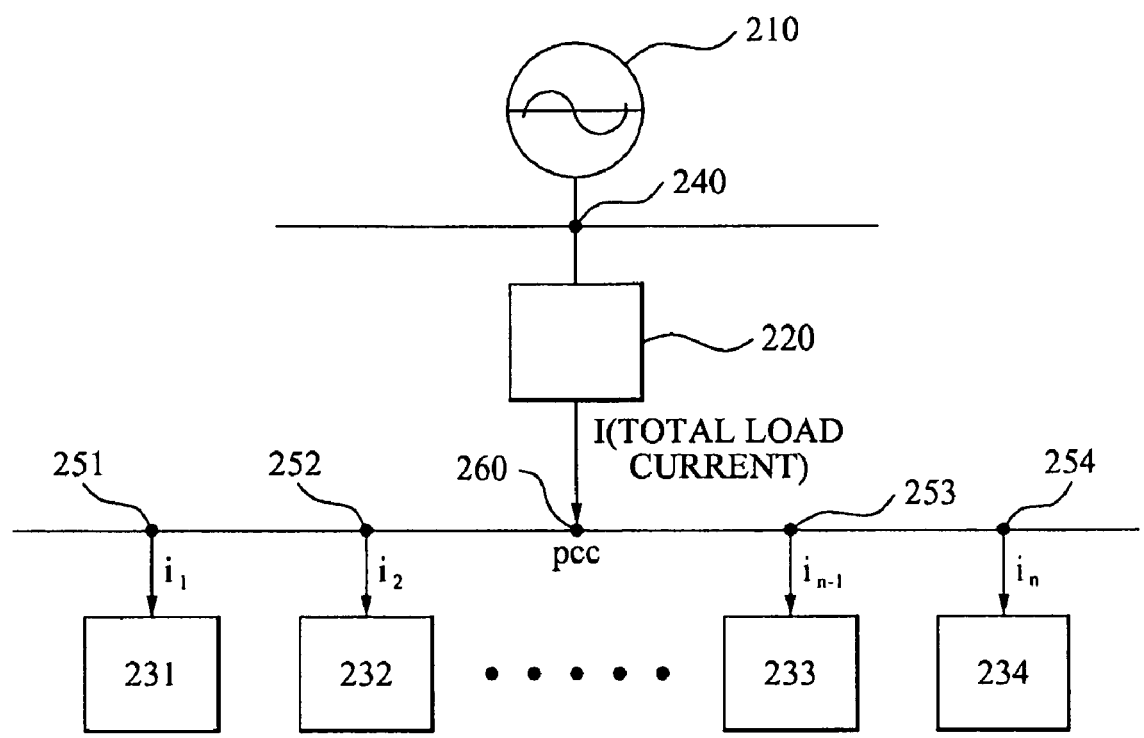
FIG. 2 is a block diagram illustrating a configuration of a customer power distribution system according to an embodiment of the present invention.

FIG. 2 is a block diagram illustrating a configuration of a customer power distribution system according to an embodiment of the present invention.

The customer power distribution system includes a substation 210, a feeder 220, and at least one load 231 through 234. Also, a first sensor 240 is installed at the feeder 220, and second sensors 251 through 254 are installed at each of the at least one load 231 through 234.

A current waveform measurement unit 110 includes the first sensor 240 and the second sensors 251 through 254. That is, the current waveform measurement unit 110 measures a total current waveform flowing in the feeder 220 through the first sensor 240, and a current waveform flowing in each of the at least one load 231 through 234 through the second sensors 251 through 254.

A voltage waveform measurement unit 120 measures a voltage waveform through a sensor 260 installed at a point of common coupling (PCC). Since each of the at least one load 231 through 234 is connected in parallel, the voltage waveform with respect to each of the at least one load 231 through 234 may be measured simply by measuring the voltage waveform at the PCC.

Referring again to FIG. 1, an LC computation unit 130 computes an LC of a customer using the total current waveform and the current waveform of each of the at least one load 231 through 234.

In general, a configuration of load is not known in an actual customer environment. In such an environment, the configuration of load may be deduced from a known current waveform of individual load component. A total electric load current is measured in an ingress of customer, and a Fourier analysis result of the total electric load current may be assumed as, $$i(t) = 880.0 \cos(wt) + 185.5 \cos(3wt-2°) + 75.0 \cos(5wt-4°) + 65.0 \cos(7wt-6°) \quad \text{[Equation 1]}$$

Figure 3:
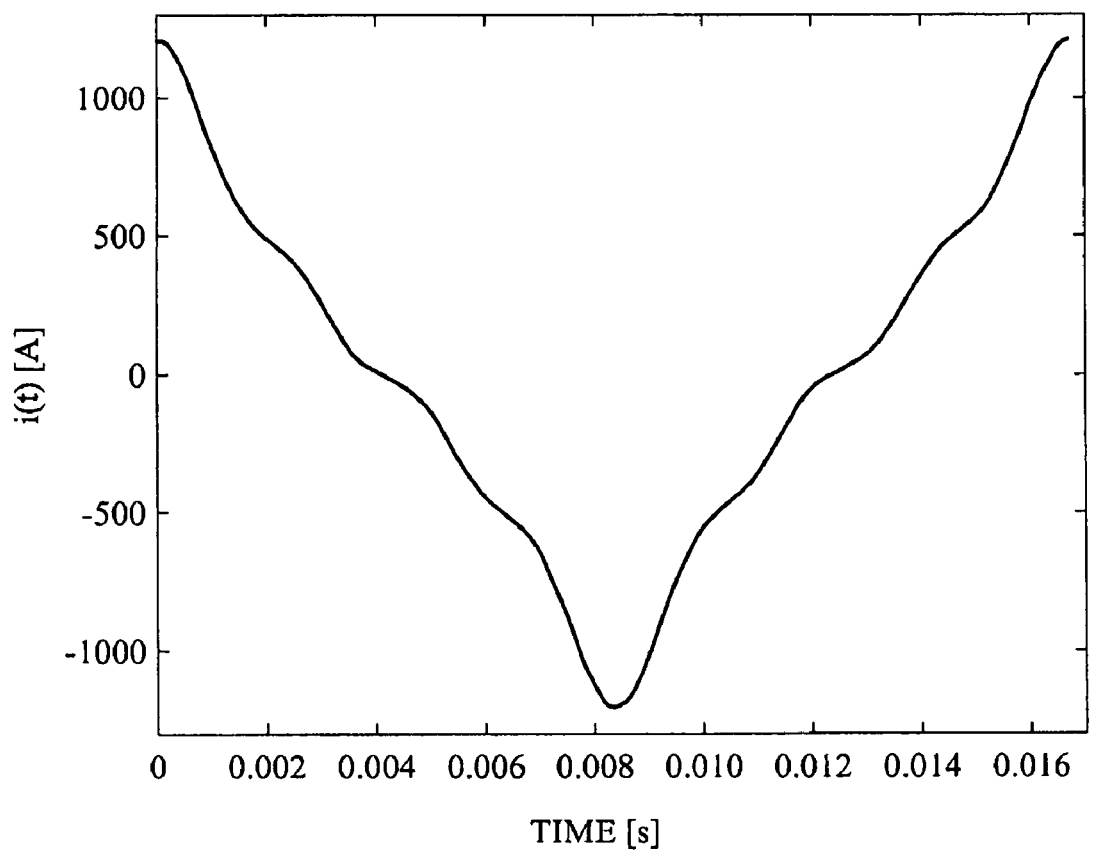
FIG. 3 is a graph illustrating a total current waveform measured for a period T of a fundamental frequency in an ingress of a customer according to an embodiment of the present invention.

Here, a fundamental frequency is 60 Hz. A line voltage of the ingress of the customer is 480 V which is a nominal sine wave and used as a peak value. FIG. 3 illustrates a waveform of a total electric load current i(t) for a period T in Equation 1. In this instance, a number of used data samples is 16667. A sampling frequency is high enough to satisfy a Nyquist theory with respect to basic elements and other frequency components (3, 5, 7 harmonics).

Figure 4:
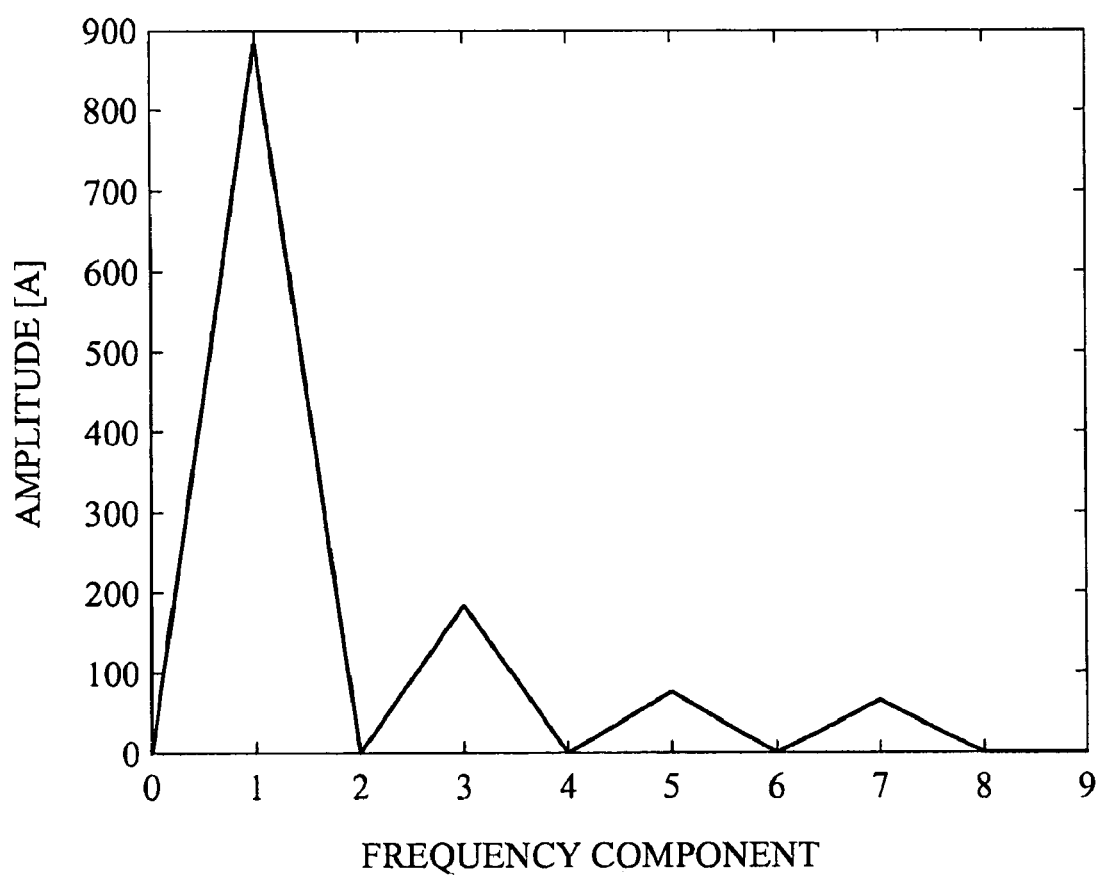
FIG. 4 is a graph illustrating frequency components after applying a discrete fast Fourier transform (DFFT) according to an embodiment of the present invention.
Figure 5A:
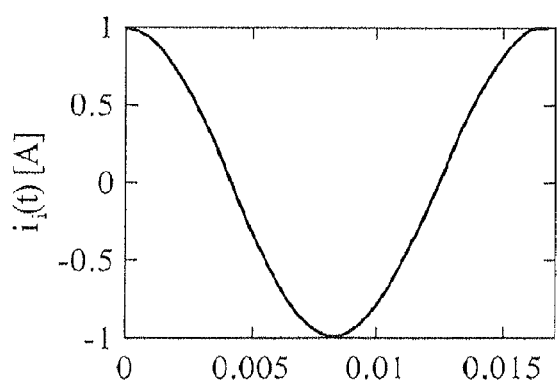
FIGS. 5a, 5b, 5c and 5d are graphs illustrating a typical current waveform for each load type for a period T of a fundamental frequency according to an embodiment of the present invention.
Figure 5B:
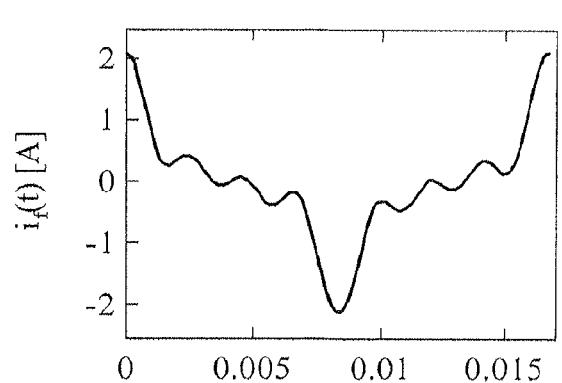
Figure 5C:
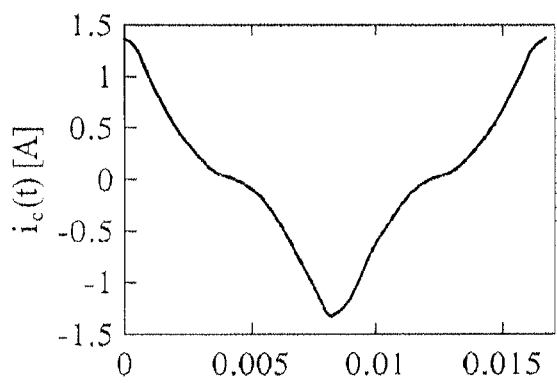
Figure 5D:
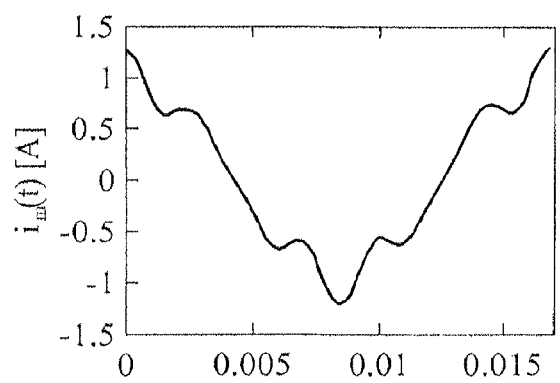

A response in a frequency domain after applying a discrete fast Fourier transform (DFFT) with respect to the total electric load current i(t) is illustrated in FIG. 4. Here, the total electric load current i(t) shows the fundamental frequency, 3 harmonic, 5 harmonic, and 7 harmonic in order. A size of each of the fundamental frequency, 3 harmonic, 5 harmonic, and 7 harmonic is the same as values of Equation 1.

When supplying a voltage as a sine wave to a particular load, a typical load group of the total electric load current i(t) is illustrated in FIGS. 5a, 5b, 5c and 5d and represented as,

TABLE 1

| Electric load type | Current waveform (reference: voltage waveform) |
|---|---|
| Incandescent lighting | $I_i(t) = 1.0 \cos(wt)$ |
| Fluorescent lighting | $I_f(t) = 1.0 \cos(wt-3°) + 0.48 \cos(3\,wt-5°) + 0.35 \cos(5\,wt-3°) + 0.28 \cos(7\,wt-2°)$ |
| Computers | $I_c(t) = 1.0 \cos(wt) + 0.28 \cos(3\,wt-1°) + 0.05 \cos(5\,wt-8°) + 0.03 \cos(7\,wt-10°)$ |
| Motor drives | $I_m(t) = 1.0 \cos(wt) + 0.15 \cos(5\,wt-8°) + 0.11 \cos(7\,wt-10°)$ |

In Table 1, an electric load type includes an incandescent lighting, fluorescent lighting, computers, and motor drives, which are represented as a subscript i, f, c, and m.

An LC computation unit 130 models a configuration of load based on the measured current waveform in order to compute a proportion of the load configuration of the customer. Along with the load group of Table 1, the total electric load current i(t) may be represented as, $$i(t) = k_1 i_i(t) + k_2 i_f(t) + k_3 i_c(t) + k_4 i_m(t), \text{ and} \quad \text{[Equation 2]}$$

$$J = \int_{t=0}^{t=T} [i(t) - k_1 i_i(t) + k_2 i_f(t) + k_3 i_c(t) + k_4 i_m(t)]^2 dt \quad \text{[Equation 3]}$$

In Equation 3, a right side of Equation 2 with respect to a load current is transposed to a left side, and {(left side)−(right side)}$^2$ is integrated for a single period of t=0~T. A differential value of function J, associated with each load coefficient in a minimum value obtained by integrating in Equation 3, is 0. Through the above computation, four equations corresponding to the four load coefficients ($k_1$, $k_2$, $k_3$, $k_4$) are obtained. A solution of the four equations is a load coefficient vector, $k = [k_1, k_2, k_3, k_4]$. Accordingly, an actual load of each electric load sample may be determined. Also, real power, virtual power, electric power charge, and the like may be easily computed.

For a computer simulation, the continuous time objective function J in Equation 3 may be mathematized as a discrete time function which is represented as, $$J = \sum_{n=0}^{N-1} [i(n) - k_1 i_i(n) + k_2 i_f(n) + k_3 i_c(n) + k_4 i_m(n)]^2. \quad \text{[Equation 4]}$$

Here, N denotes a number of samples obtained for the period T of the fundamental frequency. The objective function J is differentiated with respect to the load coefficient vector k in Equation 4, which is represented as, $$\frac{\partial J}{\partial k_1} = 2\sum_{n=0}^{N-1} [i(n) - k_1 i_i(n) + k_2 i_f(n) + k_3 i_c(n) + k_4 i_m(n)] \times \quad \text{[Equation 5]}$$
$$\{-i_i(n)\} = 0$$

$$\frac{\partial J}{\partial k_2} = 2\sum_{n=0}^{N-1} [i(n) - k_1 i_i(n) + k_2 i_f(n) + k_3 i_c(n) + k_4 i_m(n)] \times$$
$$\{-i_f(n)\} = 0$$

$$\frac{\partial J}{\partial k_3} = 2\sum_{n=0}^{N-1} [i(n) - k_1 i_i(n) + k_2 i_f(n) + k_3 i_c(n) + k_4 i_m(n)] \times$$
$$\{-i_c(n)\} = 0$$

$$\frac{\partial J}{\partial k_4} = 2\sum_{n=0}^{N-1} [i(n) - k_1 i_i(n) + k_2 i_f(n) + k_3 i_c(n) + k_4 i_m(n)] \times$$
$$\{-i_m(n)\} = 0$$

Equation 5 is arranged as a linear system equation of Ax=b, which is represented as Equation 6. Thus, a solution x of an equation having the coefficient vector k may be obtained directly or repeatedly through a variety of calculation algorithms.

$$\begin{bmatrix} \sum_{n=0}^{N-1} i_i(n) \cdot i_i(n) & \sum_{n=0}^{N-1} i_f(n) \cdot i_i(n) & \sum_{n=0}^{N-1} i_c(n) \cdot i_i(n) & \sum_{n=0}^{N-1} i_m(n) \cdot i_i(n) \\ \sum_{n=0}^{N-1} i_i(n) \cdot i_f(n) & \sum_{n=0}^{N-1} i_f(n) \cdot i_f(n) & \sum_{n=0}^{N-1} i_c(n) \cdot i_f(n) & \sum_{n=0}^{N-1} i_m(n) \cdot i_f(n) \\ \sum_{n=0}^{N-1} i_i(n) \cdot i_c(n) & \sum_{n=0}^{N-1} i_f(n) \cdot i_c(n) & \sum_{n=0}^{N-1} i_c(n) \cdot i_c(n) & \sum_{n=0}^{N-1} i_m(n) \cdot i_c(n) \\ \sum_{n=0}^{N-1} i_i(n) \cdot i_m(n) & \sum_{n=0}^{N-1} i_f(n) \cdot i_m(n) & \sum_{n=0}^{N-1} i_c(n) \cdot i_m(n) & \sum_{n=0}^{N-1} i_m(n) \cdot i_m(n) \end{bmatrix} \begin{bmatrix} k_1 \\ k_2 \\ k_3 \\ k_4 \end{bmatrix} = \begin{bmatrix} \sum_{n=0}^{N-1} i(n) \cdot i_i(n) \\ \sum_{n=0}^{N-1} i(n) \cdot i_f(n) \\ \sum_{n=0}^{N-1} i(n) \cdot i_c(n) \\ \sum_{n=0}^{N-1} i(n) \cdot i_m(n) \end{bmatrix} \quad \text{[Equation 6]}$$

After modeling the electric load of the customer as Equation 6, in order to calculate the load coefficient k, the solution x of Equation 6 may be obtained by multiplying a vector b by an inverse of A as $x=k=A^{-1}b=[k_1, k_2, k_3, k_4]=[0.1935, 0.1220, 0.5433, 0.1412]^T$ (normalized).

According to an embodiment of the present invention, the LC computation unit 130 sets a modeling function like Equation 6 through the modeling of the electric load, and thereby may compute the proportion of the load configuration through the computation of the solution of the modeling function.

The LC computation unit 130 may optimize the load configuration proportion through an optimization method. The optimization method may be a conjugate gradient method or a Broyden Fletcher Goldfarb Shanno (BFGS) method, which is widely used in the related art.

According to another embodiment of the present invention, the LC computation unit 130 may compute the load configuration proportion through a prediction method without setting the modeling function. A Kalman filter algorithm may be applied as the prediction method.

Referring again to FIG. 1, the LC computation unit 130 computes a load configuration proportion of LC=[$k_1$, $k_2$, $k_3$, $k_4$]=[0.1935, 0.1220, 0.5434, 0.1434] according to an embodiment of the present invention, as described above with reference to FIGS. 3 through 5a-5d.

Also, the LC computation unit 130 may compute the real power, apparent power, and the like using the load configuration proportion. The LC computation unit 130 may compute distortion power using the real power and apparent power through a method widely used in the related art. According to an embodiment of the present invention, the distortion power may be computed as D=[$D_i$, $D_f$, $D_c$, $D_m$]=[0, 9.757, 18.952, 3.204] (KW).

A THD computation unit 140 computes a THD of each load using the current waveform and the voltage waveform of each of the loads.

The THD computation unit 140 performs a discrete fast Fourier transform (DFFT) of the current waveform and the voltage waveform of each of the loads. Also, the THD computation unit 140 computes a current THD with respect to a current flowing in each of the loads using the discrete fast Fourier transformed current waveform, and computes a voltage THD with respect to a voltage applied to each of the loads using the discrete fast Fourier transformed voltage waveform.

The THD computation unit 140 may compute the current THD and the voltage THD using Equation 7:

$$THD(i_n) = \left(\sqrt{\sum_{n=0}^{\infty} i_h^2 / i_1}\right) \times 100. \quad \text{[Equation 7]}$$

Here, h denotes a harmonic excluding the fundamental frequency. According to an embodiment of the present invention described above, the THD computation unit 140 may compute a voltage THD, $THD_v$, with respect to PCC voltage as 0% through Equation 7. Also, the THD computation unit 140 may compute a current THD, $THD_I$, with respect to load current as $THD_I$=[$THD_{I,i}$, $THD_{I,f}$, $THD_{I,c}$, $THD_{I,m}$]=[0, 62.6758, 28.6020, 18.6012] (%).

A DPQI computation unit 150 computes a DPQI of each of the loads using the LC and the THD.

That is, the DPQI computation unit 150 computes an absolute value of a difference between the current THD and the voltage THD with respect to each of the loads, multiplies the absolute value by the LC with respect to each of the loads, and thereby may compute the DPQI. The DPQI computation unit 150 may compute the DPQI using Equation 8:

$$DPQI_P = LC_P * |THD_{I,p} - THD_{V,pcc}| \quad \text{[Equation 8]}$$

Here, LC denotes the load configuration proportion of customer load, and p denotes a type of the customer load. $THD_{I,p}$ denotes the current THD of each of the loads, and $THD_{V,pcc}$ denotes the voltage THD of each of the loads.

Since $LC=[k_1, k_2, k_3, k_4]=[0.1935, 0.1220, 0.5434, 0.1434]$, $THD_V=0(\%)$, and $THD_I=[THD_{I,i}, THD_{I,f}, THD_{I,c}, THD_{I,m}]=[0, 62.6758, 28.6020, 18.6012]$ (%), the DPQI computation unit 150 may compute the DPQI of the customer as DPQI=[0, 8.0112, 15.5382, 2.6266].

Also, the DPQI computation unit 150 may compare a distortion power generation amount with respect to each of the loads of the customer through ranking of the DPQI of each of the loads.

TABLE 2

| load type | Incandescent lighting | Fluorescent lighting | computers | Motor drives |
|---|---|---|---|---|
| DPQI | 0 | 8.0112 | 15.5382 | 2.6266 |
| DPQI ranking | 4 | 2 | 1 | 3 |
| DP ranking | 4 | 2 | 1 | 3 |
| THD ranking | 4 | 1 | 2 | 3 |

In Table 2, DPQI, DPQI ranking, DP ranking, and THD ranking, computed with respect to each load of the customer (incandescent lighting, fluorescent lighting, computers, and motor drives) by the DPQI computation unit 150, are shown.

As shown in Table 2, when considering a power quality ranking, a THD index where the load configuration proportion is not considered reflects only a portion of a waveform distortion. Accordingly, the THD index is not closely related to the distortion power affecting an actual power quality. Thus, the THD ranking is identical to the DP ranking with respect to an actual distortion power. However, according to an embodiment of the present invention, the DPQI ranking measured considering the load configuration proportion is identical to the DP ranking with respect to the actual distortion power.

Also, the DPQI computation unit 150 may standardize by dividing the DPQI of each of the loads by a sum of DPQIs of the loads, and compare a distortion power generation amount with respect to each of the loads of the customer through the standardized DPQI of each of the loads.

Specifically, when each element of the distortion power D=[0, 0.9757, 18.952, 3.204] (KW) computed by the DPQI computation unit 150 is divided by a total distortion power generated at the customer to standardize, $D_N=[0, 0.3057, 0.5939, 0.1004]$ is obtained. Also, when dividing the DPQI=[0, 8.0112, 15.5382, 2.6266] by the sum of DPQIs to standardize, $DPQI_N=[0, 0.3061, 0.5936, 0.1004]$ is obtained. Accordingly, $D_N$, a value where the actual distortion power is standardized is almost identical to the $DPQI_N$ which is the DPQI according to an embodiment of the present invention.

Thus, the method of measuring a distortion power quality index may accurately determine how much each nonlinear load of the customer generates distortion power in the distributed power system and causes a deterioration of power quality.

Figure 6:
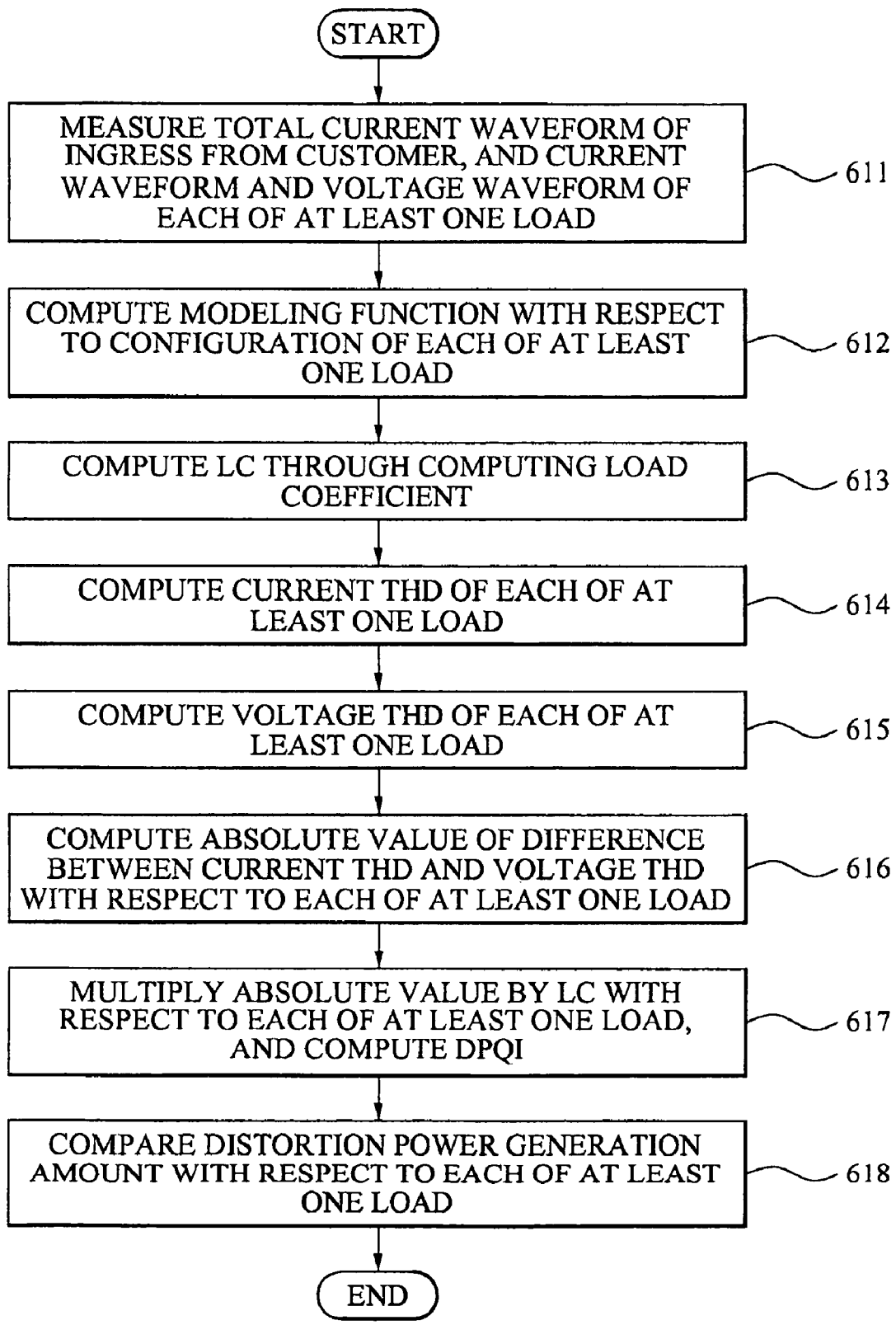
FIG. 6 is a flowchart illustrating a method of measuring a power quality index according to an embodiment of the present invention.

FIG. 6 is a flowchart illustrating a method of measuring a power quality index according to an embodiment of the present invention.

In operation 611, an apparatus for measuring a power quality index measures a total current waveform of an ingress from a customer, and a current waveform and a voltage waveform of each of at least one load installed at the customer. The customer may include a PCC and at least one nonlinear load.

In operation 612, the apparatus for measuring a power quality index computes a modeling function with respect to a configuration of each of the at least one load using the total current waveform of the ingress and the current waveform of each of the at least one load. In operation 613, the apparatus for measuring a power quality index computes a load coefficient (LC) of each of the at least one load through an optimization method from the modeling function, and computes an LC of the customer.

The apparatus for measuring a power quality index performs a DFFT of the current waveform and the voltage waveform of each of the at least one load, computes a current THD with respect to a current flowing in each of the at least one load in operation 614, and computes a voltage THD with respect to a voltage applied to each of the at least one load in operation 615.

In operation 616, the apparatus for measuring a power quality index computes an absolute value of a difference between the current THD and the voltage THD with respect to each of the at least one load.

In operation 617, the apparatus for measuring a power quality index multiplies the absolute value by the LC with respect to each of the at least one load, and thereby may compute a DPQI of the customer.

In operation 618, the apparatus for measuring a power quality index compares a distortion power generation amount with respect to each of the at least one load of the customer through the DPQI.

Although the method of measuring a power quality index has been simply described with reference to FIG. 6, it is apparent to those skilled in the related art that the method of measuring a power quality index may be embodied to include all methods of measuring a power quality index of the apparatus for measuring a power quality index described with reference to FIGS. 1 through 5.

The above-described embodiment of the present invention may be recorded in computer-readable media including program instructions to implement various operations embodied by a computer. The media may also include, alone or in combination with the program instructions, data files, data structures, and the like. The media and program instructions may be those specially designed and constructed for the purposes of the present invention, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments of the present invention.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A method of measuring a power quality index, comprising:
    measuring a total current waveform of an ingress from a customer, and a current waveform and a voltage waveform of each of at least one load installed at the customer;
    computing a load composition (LC) of the customer by modeling with resect to a configuration of each of the at least one load using the total current waveform of the ingress and the current waveform of each of the at least one load;
    computing a total harmonic distortion (THD) of each of the at least one load by performing a discrete fast fourier transform (DFFT) using the current waveform and the voltage waveform of each of the at least one load; and
    computing a distortion power quality index (DPQI) of each of the at least one load by multiplying the LC and computing value based on the THD.

2. The method of claim 1, wherein the customer includes a point of common coupling (PCC) and at least one nonlinear load.

3. The method of claim 1, wherein the computing of the LC comprises:
    computing a modeling function with respect to a configuration of each of the at least one load using the total current waveform of the ingress and the current waveform of each of the at least one load; and
    computing a load coefficient with respect to each of the at least one load through an optimization method from the modeling function.

4. The method of claim 3, further comprising:
    optimizing the LC through the optimization method, and wherein the optimization method is any one of a conjugate gradient method and a Broyden Fletcher Goldfarb Shanno (BFGS) method.

5. The method of claim 1, wherein the computing of the load composition (LC) of the customer comprises Kalman filter algorithm as a prediction method.

6. The method of claim 1, wherein the computing of the THD comprises:
    performing a discrete fast Fourier transform (DFFT) of the current waveform and the voltage waveform of each of the at least one load;
    computing a current THD with respect to a current flowing in each of the at least one load using the discrete fast Fourier transformed current waveform; and
    computing a voltage THD with respect to a voltage applied to each of the at least one load using the discrete fast Fourier transformed voltage waveform.

7. The method of claim 6, wherein the computing of the DPQI comprises:
    computing an absolute value of a difference between the current THD and the voltage THD with respect to each of the at least one load; and
    multiplying the absolute value by the LC with respect to each of the at least one load.

8. The method of claim 1, further comprising:
    comparing a distortion power generation amount with respect to each of the at least one load of the customer through the DPQI of each of the at least one load.

9. The method of claim 1, further comprising:
    standardizing by dividing the DPQI of each of the at least one load by a sum of DPQIs of the at least one load; and
    comparing a distortion power generation amount with respect to each of the at least one load of the customer through the standardized DPQI of each of the at least one load.

10. A non-transitory computer-readable recording medium storing a program for implementing the method according to claim 1.

11. An apparatus for measuring a power quality index, comprising:
    a current waveform measurement unit measuring a total current waveform of an ingress from a customer, and a current waveform of each of at least one load installed at the customer;
    a voltage waveform measurement unit measuring a voltage waveform of each of the at least one load;
    an LC (load composition) computation unit computing an LC of the customer by modeling with respect to a configuration of each of the at least one load using the total current waveform of the ingress and the current waveform of each of the at least one load;
    a THD (total harmonic distortion) computation unit computing a THD of each of the at least one load by performing a discrete fast fourier transformation (DFFT) using the current waveform and the voltage waveform of each of the at least one load; and
    a DPQI (distortion power quality index) computation unit computing a DPQI of each of the at least one load by multiplying the LC and computing value based on the THD.

12. The apparatus of claim 11, wherein the customer includes a PCC (point of common coupling) and at least one nonlinear load.

13. The apparatus of claim 11, wherein the LC computation unit computes a modeling function with respect to a configuration of each of the at least one load using the total current waveform of the ingress and the current waveform of each of the at least one load, and computes a load coefficient with respect to each of the at least one load through an optimization method from the modeling function to compute the LC.

14. The apparatus of claim 13, wherein the LC computation unit optimizes the LC through the optimization method, and the optimization method is any one of a conjugate gradient method and a BFGS (Broyden Fletcher Goldfarb Shanno) method.

15. The apparatus of claim 11, wherein the LC computation unit computes an LC of the customer using Kalman filter algorithm as a prediction method.

16. The apparatus of claim 11, wherein the THD computation unit performs a DFFT (discrete fast fourier transform) of the current waveform and the voltage waveform of each of the at least one load, computes a current THD with respect to a current flowing in each of the at least one load using the discrete fast Fourier transformed current waveform, and computes a voltage THD with respect to a voltage applied to each of the at least one load using the discrete fast Fourier transformed voltage waveform.

17. The apparatus of claim 16, wherein the DPQI computation unit computes the DPQI through $DPQI_p = LC_p * |THD_{I,p} - THD_{V,pcc}|$, where LC is the LC of the customer, p is a type of a customer load, $THD_{I,p}$ is a current THD in each of the at least one load, and $THD_{V,pcc}$ is a voltage THD in a PCC (point of common coupling).

18. The apparatus of claim 11, wherein the DPQI computation unit compares a distortion power generation amount with respect to each of the at least one load of the customer through the DPQI of each of the at least one load.

19. The apparatus of claim 11, wherein the DPQI computation unit standardizes by dividing the DPQI of each of the at least one load by a sum of DPQIs of the at least one load, and compares a distortion power generation amount with respect to each of the at least one load of the customer through the standardized DPQI of each of the at least one load.

20. A wattmeter, comprising:
- a current waveform measurement unit measuring a total current waveform of an ingress from a customer, and a current waveform of each of at least one load installed at the customer;
- a voltage waveform measurement unit measuring a voltage waveform of each of the at least one load;
- an LC (load composition) computation unit computing an LC of the customer by modeling with respect to a configuration of each of the at least one load using the total current waveform of the ingress and the current waveform of each of the at least one load;
- a THD (total harmonic distortion) computation unit computing a THD of each of the at least one load by performing a discrete fast fourier transform (DFFT) using the current waveform and the voltage waveform of each of the at least one load; and
- a DPQI (distortion power quality index) computation unit computing a DPQI of each of the at least one load by multiplying the LC and computing value based on the THD.

* * * * *